United States Patent
Sato et al.

(10) Patent No.: US 7,040,388 B1
(45) Date of Patent: May 9, 2006

(54) HEAT SINK, METHOD OF MANUFACTURING THE SAME AND COOLING APPARATUS USING THE SAME

(75) Inventors: Kaoru Sato, Kumamoto (JP); Yasuhiro Fujiwara, Oonojo (JP); Seiji Manabe, Fukuoka (JP); Shinobu Kamizuru, Kasuga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/493,677

(22) Filed: Jan. 28, 2000

(30) Foreign Application Priority Data

Jan. 14, 2000 (JP) .............................. 2000-005533

(51) Int. Cl.
*H05K 7/20* (2006.01)

(52) U.S. Cl. .............. 165/185; 165/80.3; 165/121; 165/146; 174/16.3; 257/722; 361/697; 361/704

(58) Field of Classification Search ............. 165/80.3, 165/185, 146, 147, 121; 174/16.3; 257/722; 361/704, 697
See application file for complete search history.

(56) References Cited

U.S. PATENT DOCUMENTS

| | | | |
|---|---|---|---|
| 3,149,666 A * | 9/1964 | Coe ........................... 165/121 |
| 3,163,207 A * | 12/1964 | Schultz ................... 165/80.3 X |
| 3,220,471 A * | 11/1965 | Coe ........................... 165/121 |
| 3,421,578 A * | 1/1969 | Marton ................... 165/80.3 X |
| 4,292,647 A * | 9/1981 | Lee ......................... 257/722 X |
| 4,369,838 A | 1/1983 | Asanuma et al. |
| 4,449,578 A | 5/1984 | Munekawa |
| 4,777,560 A * | 10/1988 | Herrell et al. ......... 165/80.3 X |
| 4,823,869 A | 4/1989 | Arnold et al. |
| 4,879,891 A * | 11/1989 | Hinshaw .................... 165/80.3 |
| 4,918,571 A * | 4/1990 | Grabbe ........................ 257/722 |
| 5,132,780 A * | 7/1992 | Higgins, III ............... 165/80.3 |

(Continued)

FOREIGN PATENT DOCUMENTS

CA 1026013 * 2/1978 .................. 257/722

(Continued)

*Primary Examiner*—Leonard R. Leo
(74) *Attorney, Agent, or Firm*—McDermott Will & Emery LLP

(57) ABSTRACT

A heatsink of the present invention has a column having a heat conducting plate with a heat receiving face contacting a heat producing element. On the side faces of the column are a plurality of first slits disposed parallel to the heat receiving face and a plurality of second slits disposed transversely to the heat receiving face. These slits form a plurality of pillar-type protrusions functioning as fins for cooling. At least one of cross sections of the column has a shape of a rectangle, a trapezoid, a triangle or a shape which tapers off as it goes away at right angle from the heat receiving face. A method of manufacturing the heatsink of the present invention includes first and second processes. In the first process, the first slits are formed by providing a plurality of metallic plate fins on the column along its length by the methods including the extrusion molding using a metallic mold. In the second process, the second slits are formed in a direction approximately transverse to the length direction of the plate fins. By using a specialized jig for the machining of the second slits, many fins can be formed remarkably efficiently. A cooling apparatus for the present invention includes a cooling means mounted on the heatsink of the present invention. The cooling apparatus for the present invention enjoys a high cooling capability and reduced size.

25 Claims, 14 Drawing Sheets

U.S. PATENT DOCUMENTS

| | | | |
|---|---|---|---|
| 5,181,313 A | 1/1993 | Nonnemacher et al. | |
| 5,195,576 A * | 3/1993 | Hatada et al. | 165/80.3 |
| 5,353,863 A * | 10/1994 | Yu | 165/80.3 |
| 5,486,980 A * | 1/1996 | Jordan et al. | 361/697 |
| 5,576,932 A * | 11/1996 | Bishop et al. | 361/697 |
| 5,598,322 A | 1/1997 | Von Arx et al. | |
| 5,647,430 A | 7/1997 | Tajima | |
| 5,677,829 A * | 10/1997 | Clemens | 361/697 |
| 5,740,014 A * | 4/1998 | Lin | 361/697 |
| 5,748,445 A * | 5/1998 | North et al. | 361/697 |
| 5,775,418 A | 7/1998 | Lonergan et al. | |
| 6,533,028 B1 * | 3/2003 | Sato | 165/80.3 |

FOREIGN PATENT DOCUMENTS

| | | | | |
|---|---|---|---|---|
| DE | 124861 A | 3/1977 | | |
| EP | 0206980 A2 | 12/1986 | | |
| EP | 0706212 A2 | 4/1996 | | |
| EP | 1135978 A0 | 9/2001 | | |
| JP | 50-94884 | 7/1975 | | |
| JP | 54-025168 | 2/1979 | | |
| JP | 62-182600 | 11/1987 | | |
| JP | 63-187343 | 11/1988 | | |
| JP | 2-73697 | * 3/1990 | | 361/704 |
| JP | 4-117458 | 10/1992 | | |
| JP | 4-294570 | * 10/1992 | | 257/722 |
| JP | 5-218245 | 8/1993 | | |
| JP | 05-259323 | 10/1993 | | |
| JP | 6-9144 | 2/1994 | | |
| JP | 6-61667 | * 3/1994 | | 174/16.3 |
| JP | 07-183432 | 7/1995 | | |
| JP | 08-316389 | 11/1996 | | |
| JP | 10-092985 | 4/1998 | | |
| JP | 10-242352 | 9/1998 | | |
| JP | 11-047960 | 2/1999 | | |
| WO | WO 97/35460 | 9/1997 | | |

* cited by examiner

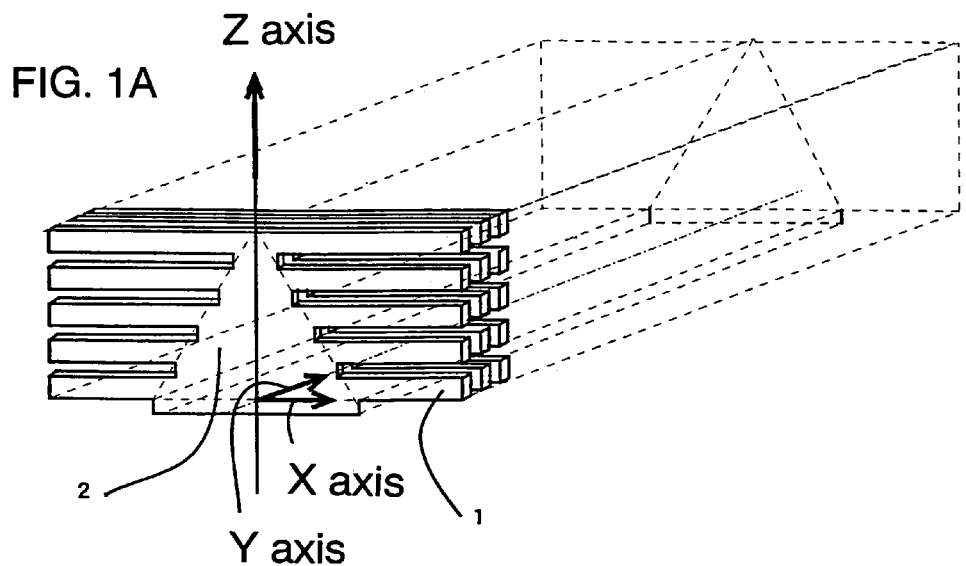
FIG. 1A
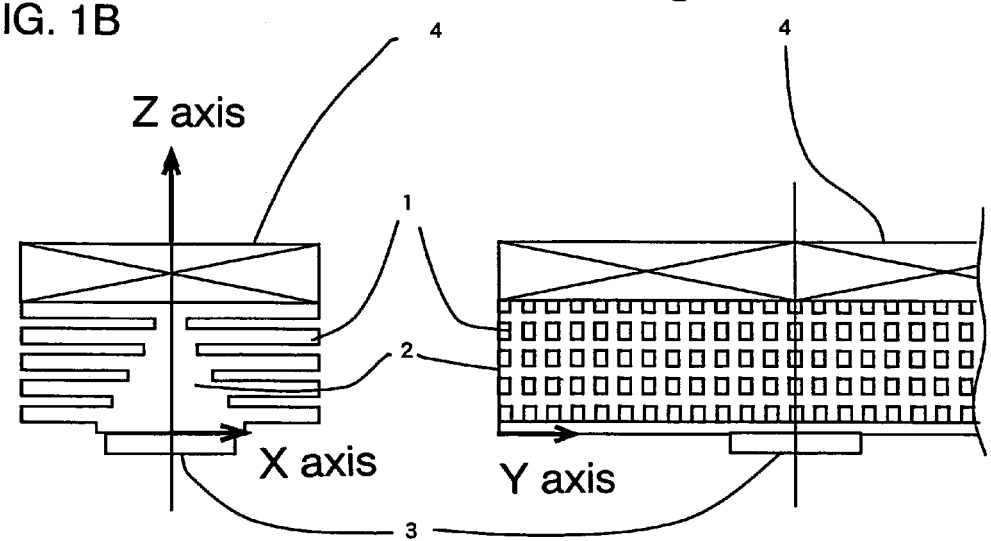
FIG. 1B
FIG. 1C

FIG. 2A
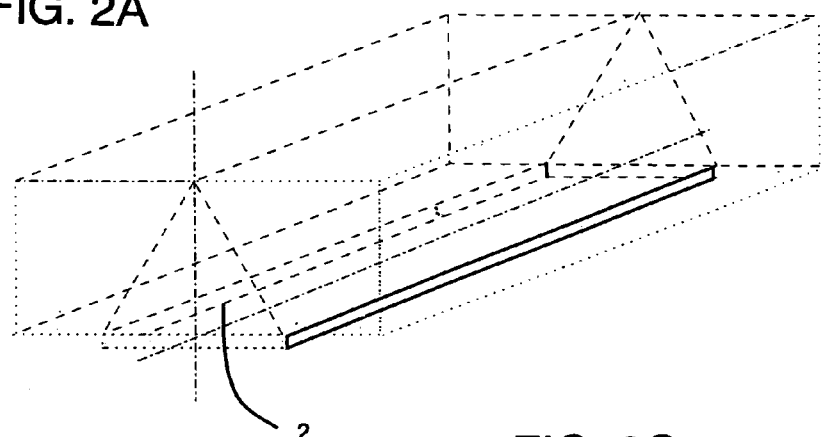
FIG. 2B
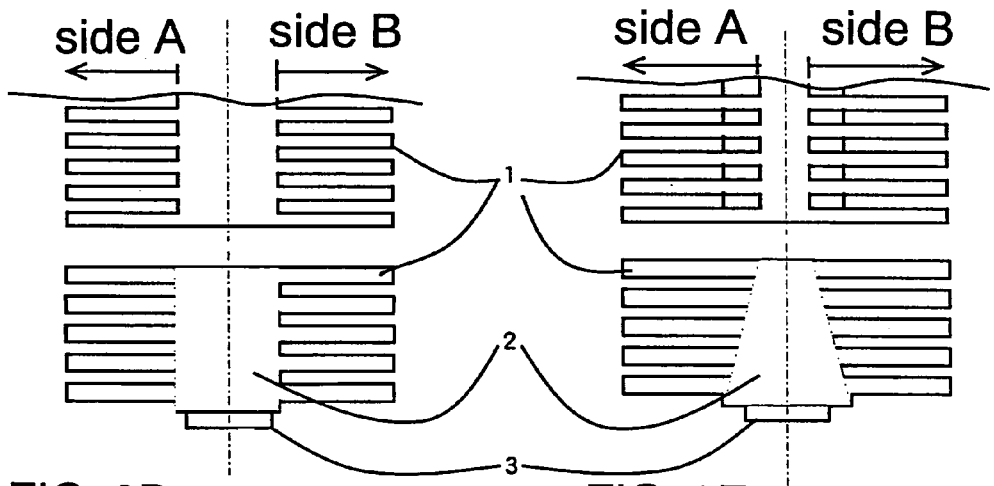
FIG. 2C
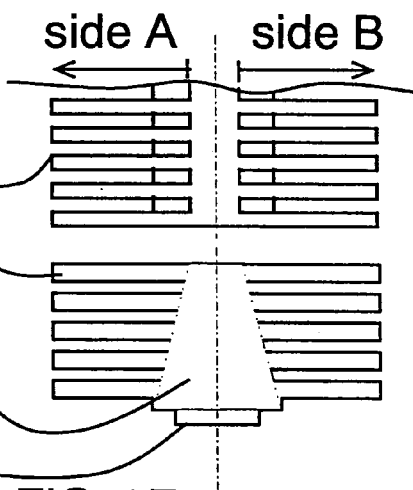
FIG. 2D
FIG. 2E
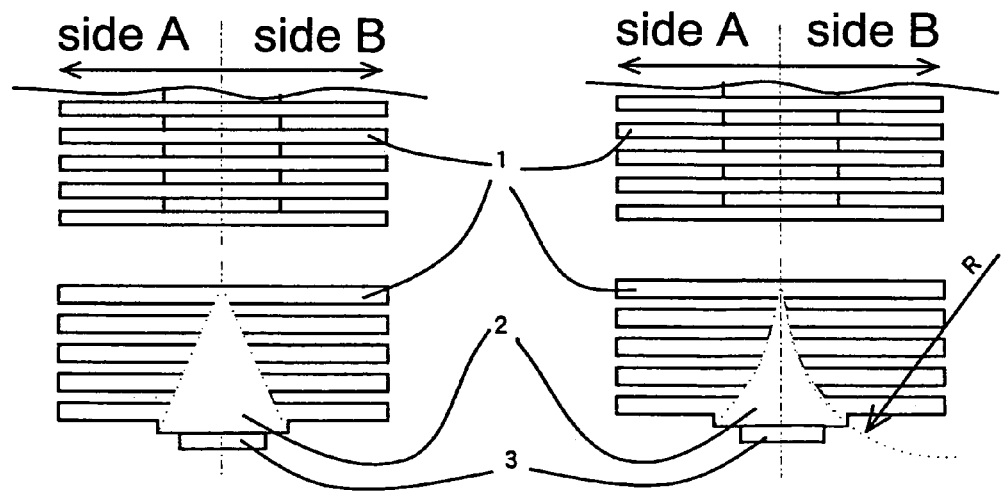

HEAT SINK, METHOD OF MANUFACTURING THE SAME AND COOLING APPARATUS USING THE SAME

FIELD OF THE INVENTION

The present invention relates generally to a heatsink which is used to cool heat producing semiconductor elements such as integrated circuits (IC), central processing units (CPU), micro processing units (MPU) and electronic components including heating sections. The present invention also relates to manufacturing methods of a heatsink, and to a cooling apparatus using the heatsink. The cooling apparatus uses the heatsink combined with cooling means such as a fan for cooling the heat producing elements.

BACKGROUND OF THE INVENTION

Integration of the electronic components such as semiconductors and increasing frequencies of operation clocks have been raising the heat produced by such components in recent years. Under such circumstances, maintaining temperatures at contact points of the electronic components within the range of the operation temperature has become a critical issue for the normal functioning of the electronic components. Increases in integration and frequency of the micro processing units (MPU) has been remarkable. Thus, dissipation of the heat produced by MPUs is particularly important for stabilizing their function and securing their operational longevity.

Heat emitted from the electronic components is, in general, dissipated by a cooling apparatus comprising a heatsink and a fan.

An example of a conventional heatsink will now be described referring to FIGS. 12, 13 and 14.

FIG. 12 shows a perspective view of a conventional heatsink. FIG. 13 shows a top view and sectional views of a conventional cooling apparatus. FIG. 14 shows a perspective view and a side view of another conventional heatsink. These heatsinks can be categorized into a plate-type heatsink where a plurality of plate fins 1c made of thin plates are disposed on a base plate 2b or a heat conduction section as shown in FIG. 12 (a), a pin-type heatsink where a plurality of fins 1 are disposed on the plate 2b as shown in FIG. 12 (b), and a tower-type heatsink where a plurality of plate fins 1c made of thin plates are disposed at right angle to the axis of column 2 as shown in FIG. 14 (a). These heatsinks are generally constructed of materials with high heat conductivity such as aluminum and copper, and produced by the extrusion molding (otherwise called pultrusion molding) method, the cold forging method, the die casting method, or the thin plates accumulating method.

The heatsinks are mounted either directly onto a heat producing element 3 as illustrated in FIG. 13 (a), or indirectly by inserting a heat diffusion plate 2c between the heat producing element 3 and the heatsink as illustrated in FIG. 13 (b) in the case of the pin-type heatsink. The heat diffusion plate conducts heat emitted from the heat producing element 3 to the heatsink, and helps to diffuse the heat and protect the heat producing element. The cooling mechanism of the cooling apparatus in use, is described as follows: heat produced by the heat producing element 3 is conducted to the pin-shaped fins 1 via the heat-conductive base plate 2b made of a highly heat conductive material such as aluminum, and, over the surface of the fins 1, convectively conducted to the air blown by a cooling fan 4 thus dissipated into the air and cooled.

In order to improve the capability of the cooling apparatus, heat is most desirably diffused throughout the heat conductive section evenly, and dissipated from all of the dissipation fins. However, in the case of the plate-type and pin-type heatsinks, heat emitted from the heat producing element 3 tends to be conducted intensively to the dissipation fins disposed right above the heat producing element 3. It is relatively hard for the heat to be conducted to the peripheral dissipation fins. The reason for this is that the heat producing element is much smaller than the heat conducting section, thus contact area between them is very limited. Consequently, with the plate-type and the pin-type heatsinks, the heat dissipation fins as a whole often fail to function effectively.

It could be argued that if the amount of air flow around the heat dissipation fins is the same, the heat dissipating capability can be increased by expanding the surface area by increasing the number of fins. In reality however, considering unit area, when the sectional area of the heat dissipation fins is increased, the area where air can flow into, such as an air flow area 7e (marked with diagonal lines in FIG. 13 (a)) decreases, as does the total volume of air flow. Therefore, in some cases, the heat dissipation capability lowers as a result. In other words, a mere increase in the number of dissipation fins does not bring about an improvement.

The most important aspect for the dissipation of heat is to effectively conduct heat produced by the heat producing element 3 to the dissipation fins to the largest possible area.

To solve the foregoing problems the tower-type heatsink shown in FIG. 14 has been introduced. In this kind of heatsink, heat produced in the heat producing element is conducted directly to the upper part of the heatsink by a central column, and spread flatly by the plate fins 1c formed at a right angle to the axis of the column. The heat which has been spread flatly on the both faces of the thin plates is generally dissipated into the air by natural air cooling. In this tower-type heat sink, improvements have been proposed to increase the dissipation capability. For example, Japanese Patent Laid Open Publication No. S62-182600 discloses a heatsink where through-hole vents are formed on the surface of the thin plates by cutting and standing the cut edges of the thin plates in the process of producing the plate fins. Through these vents, air is permitted to convect more easily in the direction parallel to the axis of the column.

However, development of electronic components used in high speed processing such as semiconductors has been resulted in a relative increase in the amount of heat produced. As a result, conventional cooling apparatus are now facing difficulties in cooling electronic components sufficiently, especially when it comes to electronic components such as MPU which produce significant amount of heat, the conventional cooling apparatus fail to reach their full capability. In some cases, temperature rise in MPUs led to thermal runaway and caused electronic apparatus to malfunction. To deal with increases in heat generation, it is possible to enhance the cooling capability by making the cooling apparatus itself larger. However, the size of the electronic apparatus itself inevitably limits the size and weight of the cooling apparatus.

Compared with other types, the construction of the tower-type heatsink realizes a better heat conductivity, however, it also tends to trap air. Furthermore, it is difficult to dispose a cooling fan on the top of the tower-type heatsink, therefore, the cooling fan must be disposed on a side face of the heatsink. However, if the cooling fan is disposed in such a manner, the heatsink is required to be as high as the cooling fan. Thus, the cooling apparatus as a whole becomes remarkably large. Despite its size, however, the dissipation efficiency can not be improved satisfactorily.

The present invention aims to address the foregoing problems, and to provide a compact and highly efficient heatsink and a small cooling apparatus with high cooling ability using the heatsink. The present invention further aims at providing a manufacturing method of the heatsink which achieves the production of a highly effective heatsink in a productive and inexpensive manner.

SUMMARY OF THE INVENTION

A heatsink of the present invention has a column having a heat conducting plate with a heat receiving face in contact with a heat producing element. On the side faces of the column are a plurality of first slits disposed parallel to the heat receiving face and a plurality of second slits disposed transversely to the heat receiving face. These slits form a plurality of pillar-type protrusions functioning as cooling fins. Hereinafter, the pillar-type protrusions are called fins.

Another heatsink of the present invention includes a heat conducting plate section having a heat receiving face and a column which acts as a heat conducting section by protruding opposite the heat receiving face of the heat conducting plate section. At least one cross section of the column has a shape of a rectangle, a trapezoid, a triangle or some shape which tapers off as it goes away at right angle from the heat receiving face. On the side faces of the column are a plurality of fins formed along the heat receiving face.

Although the heatsink of the present invention is compact it can effectively lead the heat produced by the heat producing element throughout the heatsink, thus realizing high heat dissipating properties. The heatsinks which have especially superior heat dissipating properties include the following types:

a heatsink in which fins are disposed such that their central lines are disposed transversely at a right angle to the base line which is substantially vertical to the heat receiving face, a heatsink in which fins are disposed such that their central lines are disposed transversely at a predetermined angle to the base line vertical to the heat receiving face; and a heatsink in which fins are disposed such that their central lines are disposed transversely at a predetermined angle to the base line vertical to the heat receiving face, and the tips of the plurality of fins extend as high as the top face of the column.

When the plurality of fins have recesses or protrusions on the surface thereof, the dissipation effect of heat into air is especially enhanced.

The manufacturing method of the heatsink of the present invention includes first and second processes. In the first process, the first slits are formed by providing a plurality of metallic plate fins in the column and its length directions by the methods including extrusion molding using a metallic mold. In the second process, the second slits are formed in a direction approximately transverse to the length direction of the plate fins. By using a specialized jig for the process of producing the second slits, many fins can be formed remarkably effectively.

This manufacturing method achieves productive and inexpensive production of high-performance heatsinks.

A cooling apparatus of the present invention includes a cooling means mounted on the heatsink of the present invention. Mounting a wind blowing means such as a fan opposite the heat receiving face allows the cooling apparatus of the present invention to enjoy a high cooling capability and to be reduced in size.

BRIEF DESCRIPTION OF THE DRAWINGS

FIG. 1 shows a perspective view and side views of the main part of a heatsink in accordance with a first preferred embodiment of the present invention.

FIG. 2 shows a perspective view illustrating the external shape of a heatsink and sectional views of columns of the heat sinks in accordance with the first preferred embodiment of the present invention.

DESCRIPTION OF PREFERRED EMBODIMENTS

Figure 3A:
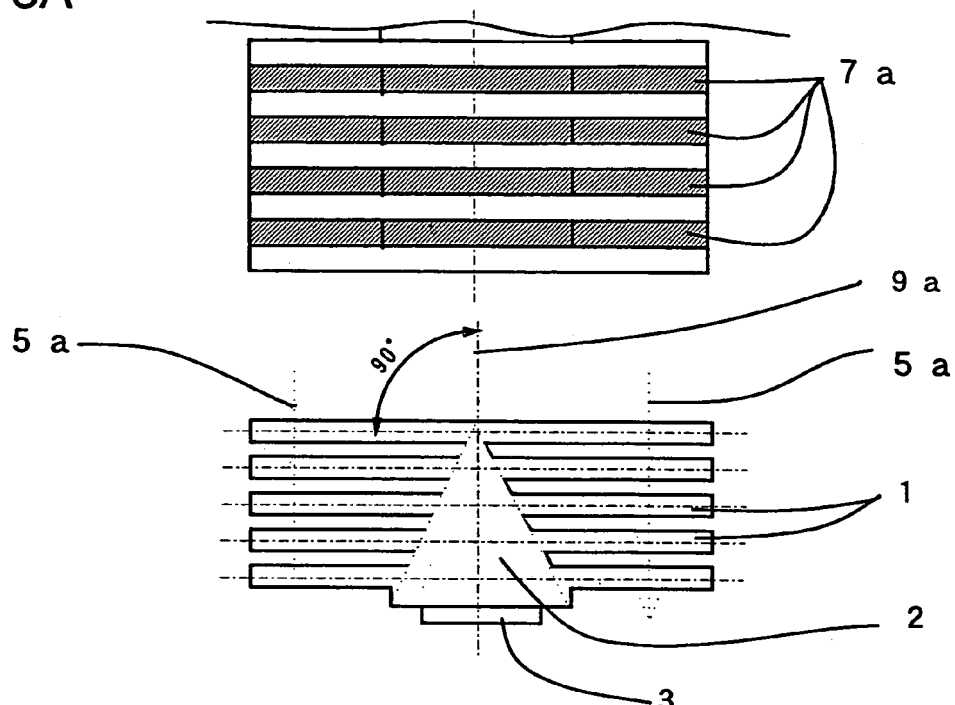
FIG. 3 shows plan views and side views of a heatsink in accordance with a second preferred embodiment of the present invention.

The preferred embodiments of the present invention are described hereinafter with reference to the drawings.

The First Embodiment

FIG. 1 shows a perspective view and side views of the main part of a heatsink in accordance with a first preferred embodiment of the present invention. FIG. 1 (*a*) is a perspective view of the heatsink according to the first preferred embodiment of the present invention. FIG. 1 (*b*) is a sectional view of a cooling apparatus of the present invention disposed right on the top of a heat producing element 3 viewed from the perspective of the length direction of a column 2 (hereinafter, Y axis direction) when a cooling fan 4 is mounted. FIG. 1 (c) is a side view of a cooling apparatus of the present invention viewed from the perspective of the width direction of the column 2 (hereinafter, X axis direction) when the cooling fan 4 is mounted.

FIG. 2 shows a perspective view illustrating the external shape of a heatsink and sectional views of columns of the heatsink in accordance with the first embodiment of the present invention. FIG. 2 (a) is a perspective view of the external shape (drawn by broken line) of the heatsink of the first embodiment of the present invention. FIGS. 2 (b)–(e) show plan views and side views of the heatsink of the first embodiment of the present invention with different sectional shapes.

In FIGS. 1 (a)–(c), a plurality of fins 1 are disposed on the column 2 (or heat conducting section). The heat producing element 3 is disposed under the column 2 (hereinafter, negative Z axis direction). On the top of the heatsink is the cooling fan 4.

In sum, in this embodiment, the heatsink comprises the fins 1 and the column 2. The heat producing element 3 here is an electronic component which produces heat including semiconductors and transistors such as IC, LCI and MPU.

For the sake of convenience of description, width, length and height directions of the column are, in some cases, expressed as X axis, Y axis and Z axis directions as mentioned previously.

In FIG. 1, the column 2 is a prism of which a cross section through Y axis direction is a triangle. Creating the shape of the column 2 in this manner improves contact between the column 2 and the heat producing element 3 and reduces waste of the materials. It especially contributes to providing a heatsink with superior mountability and heat conductivity. The column 2 has fins 1 disposed thereon. The fins 1 in FIG. 1 are disposed on both faces of the column.

The construction of the heatsink of the present invention can realize a compact cooling apparatus having superior heat conductivity and heat dissipation properties.

In the heatsink of the first preferred embodiment shown in FIG. 1, heat produced by the heat producing element 3 is received on the bottom surface of the prism column 2 (or heat receiving face) which contacts with the heating surface of the heat producing element 3. The heat is then diffused three-dimensionally to in the directions of the X, Y and Z axes from the bottom surface of the column 2. In this case, since the column 2 is a prism, a stable hemispherical temperature distribution can be achieved over a much larger area inside the column compared with the plate heat conducting section of the conventional plate-type and pin-type heatsinks. The heat emitted from the heat producing element 3 is conducted over the hemispherical temperature distribution range and to the fins 1 which function as heat dissipating fins. As a result, the heatsink of this embodiment achieves significantly higher heat dissipation properties than the conventional heatsinks of the same size. Furthermore, even in the vicinity of both ends of the heatsink where such hemispherical temperature distribution is hard to obtain, fins 1 can sufficiently function as heat dissipation fins since the sectional area of the column 2 is large enough to maintain a low heat resistance associated with the transfer of heat.

FIGS. 2 (b) and (c) shows constructions of a plurality of other embodiments where the sectional shapes of column 2 of the heatsink illustrated in FIG. 1 are changed. In FIGS. 2 (b) and (c), differences in sectional shapes of the column 2 produces difference in the sectional area of the column 2 and the sectional area of an air flow section of which opening is placed on the cooling fan side at the top. FIG. 2(a) shows the condition of the column 2 when the cross section of the column shown in FIG. 1 is triangular. The sectional area of the column 2 which directly affects the diffusion of the heat, becomes progressively smaller according to its shape in the following order; square shown in FIG. 2 (e), trapezoid, in FIG. 2 (c), triangle, in FIG. 2 (d), and bell-shape (or a shape having a curved face with a curvature radius of "R") in FIG. 2 (e). In order to conduct (or diffuse) heat to the largest possible area, it is desirable to ensure that the column 2 has the largest possible sectional area.

On the contrary, the sectional area of the air flow section which is concerned with the volume of air which dissipates heat outside, becomes larger as the length of a side A and a side B having an opening on the top of the heatsink becomes longer. Thus, the sectional area of the air flow section expands according to the shape of the column in the following order; square, shown in FIG. 2 (e), trapezoid, in FIG. 2 (c), triangle, in FIG. 2 (d), and bell-shape, in FIG. 2 (e). It is desirable to provide the air flow section with the largest possible sectional area so as to obtain sufficient volume of air flow.

Therefore, ideally the sectional area of the column 2 which conducts heat produced by the heat producing element 3 as well as the area of the air flow section are the largest possible so as to obtain the maximum air flow necessary for dissipating heat. The two have in some ways a conflicting relationship. However, what is needed is to select the shape of the column 2 with the largest possible sectional area while maintaining the maximum air flow area to ensure sufficient volume of air to dissipate heat. Among the constructions illustrated in FIGS. 2 (b)–(e), ones in FIGS. 2 (d) and (e) are desirable since the air flow sections have sufficient width (the total length of the sides A and B) and the sectional area of the column 2 is large.

In these heatsinks, end faces of the fins 1 and the bottom corners of the column 2 are desirably chamfered. The chamfering prevents chipping and generation of undesirable material. If a corner is sharp, the heatsink may contact with other components when it is being mounted onto an electronic component and break the component. When material is generated from a chipped corner and falls on wiring, it might trigger a short circuit and cause the electronic apparatus to malfunction.

The column 2 and the fins 1 can be integrally formed, or the fins can be adhered to the column 2 as separate parts with adhesives. As another method, the fins 1 can be press fitted into holes provided on the column 2.

When the column 2 and the fins 1 are integrally formed, productivity improves. Furthermore, heat conductivity improves as no heat-resistance part exists between the column 2 and the fins 1. When the fins 1 are fixed to the column 2 by the adhesive or press-fitting method, appropriate materials can be used for the column 2 and the fins 1, thereby promoting ease of design of the heatsink.

For the construction of the fins 1, a square pole as shown in FIG. 1, a cylinder, a polygonal pole, a elliptic cylinder and the like can be used. By forming the fins 1 to have a shape of square pole, the mounting density of the fins 1 can be enhanced, thereby improving the heat dissipation.

In this embodiment, thickness of the fins 1 was set approximately the same. However, the fins 1 can be designed such that they have a taper of which either the thickest or thinnest part is fixed to the column 2. The fins 1 can also be designed so that the center of it is thinner or thicker than the other parts.

Chamfering of the corners of the fins 1 prevents generation of the undesirable material caused by chipping as previously mentioned.

Furthermore, when the fins 1 are disposed at regular intervals, heat dissipation and productivity are desirably improved. In other words, by disposing the fins 1 at regular intervals, the convection of air improves, and the manufacturing of the heatsink is faciliated.

Desirable materials for the heatsinks are ones which have a heat conductivity at 100° C. of 100 k/W·m$^{-1}$·K$^{-1}$ or more. Such materials can be selected from zinc, aluminum, brass, gold, silver, tungsten, copper, beryllium, magnesium, and molybdenum (hereinafter, material group), and used in their pure form. These materials can also be used in an alloy form. In the latter case it is possible to either select a plurality of alloys from the above-mentioned group or select at least one from the material group and alloying it with materials not included in the above group. In this embodiment, aluminum and an aluminum alloy and at least one other material selected from the material group were used because of its ease of processing and low cost.

The Second Embodiment

Figure 3B:
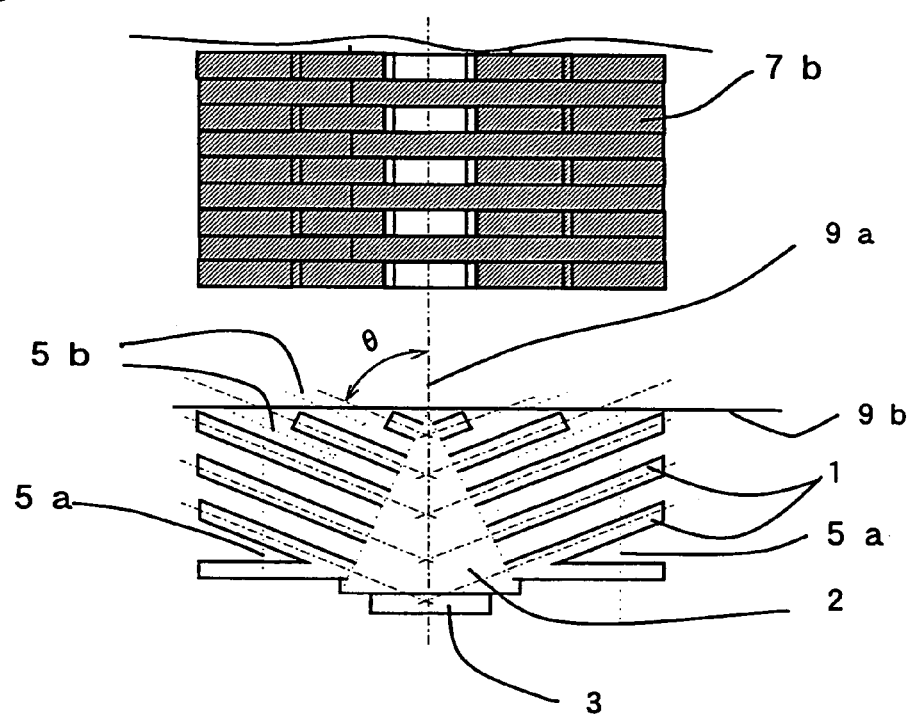
Figure 4A:
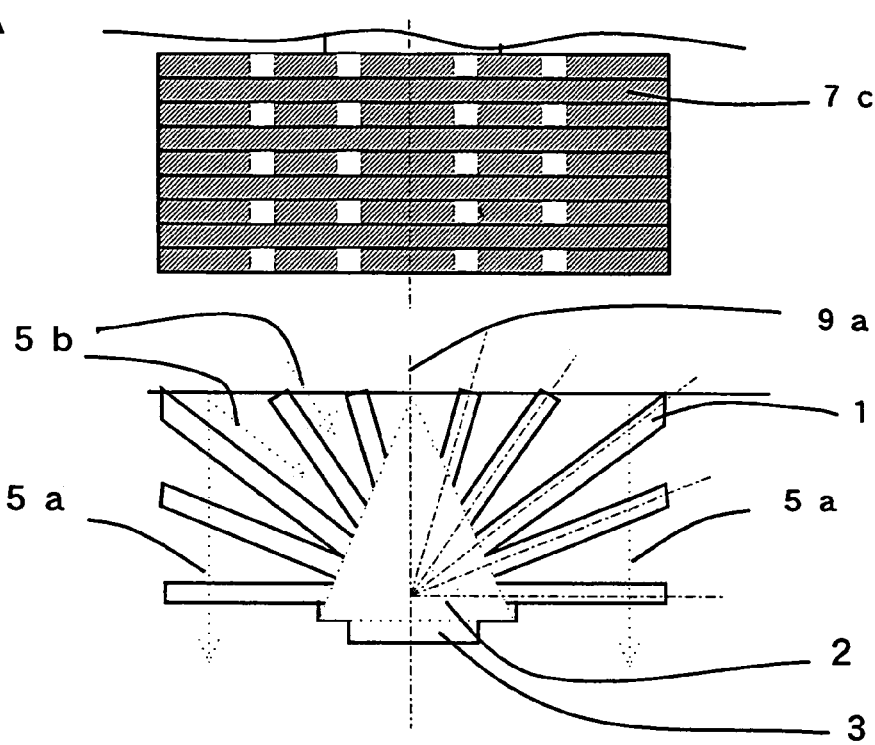
FIG. 4 shows plan views and side views of a heatsink in accordance with the second preferred embodiment of the present invention.
Figure 4B:
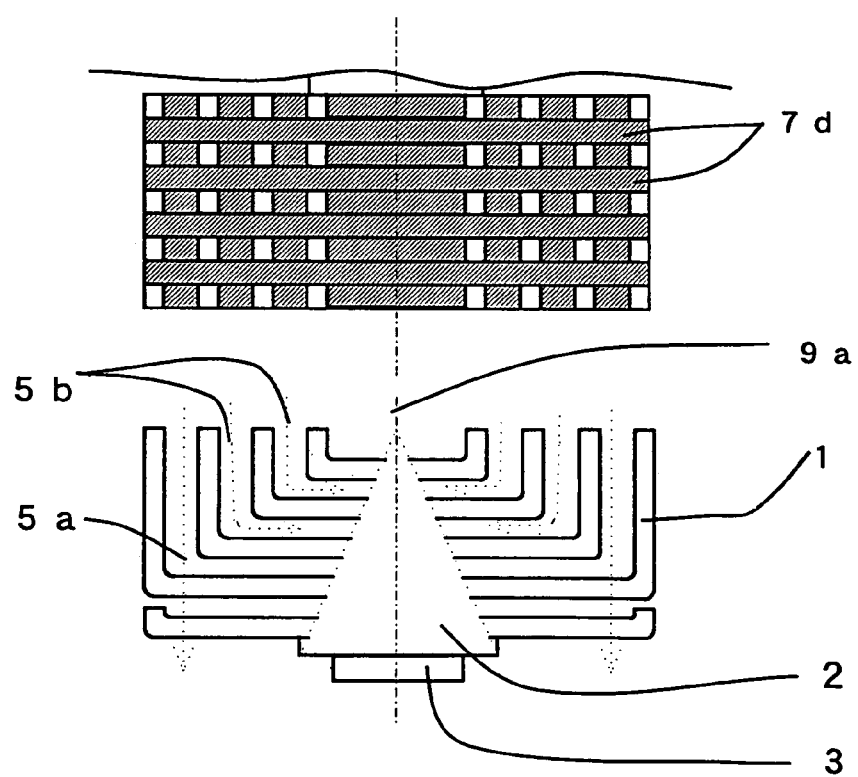

FIGS. 3 and 4 show plan views and side views of the second embodiment of the present invention in which the construction of the column and fins of the heatsink is changed.

In FIG. 3 (a), the axis of the fins 1 are set at right angle against a base line 9a which is vertical to the heating face of the column 2. By disposing the fins 1 on both side faces of the column 2 placed in the middle, the surface area as a heat dissipating surface can be securely provided by the fins 1 while keeping the height of the heatsink low.

The cooling fan is mounted on the top of the heatsink. Air blown by the cooling fan travels through an air flow section 7a (gap between fins) marked with diagonal lines and the heatsink from the top to the bottom similar to an air current 5a to radiate heat of the fins 1.

Figure 13A:
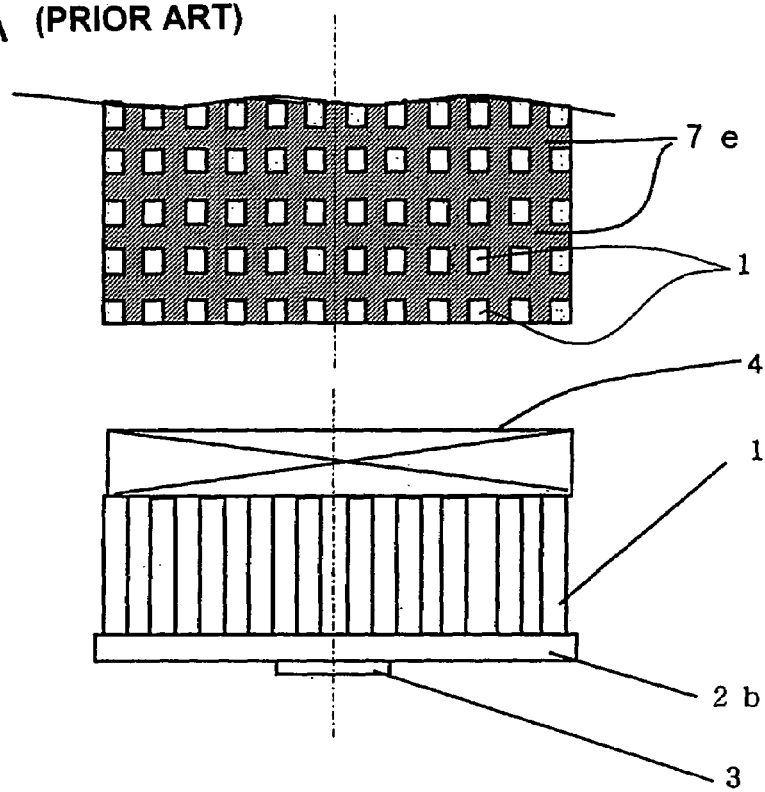
FIG. 13 shows a plan view and sectional views of a conventional cooling apparatus.
Figure 13B:
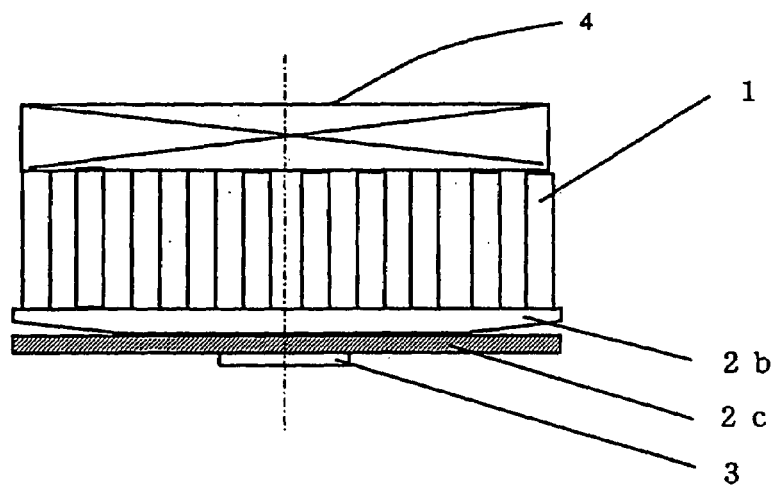
Figure 14A:
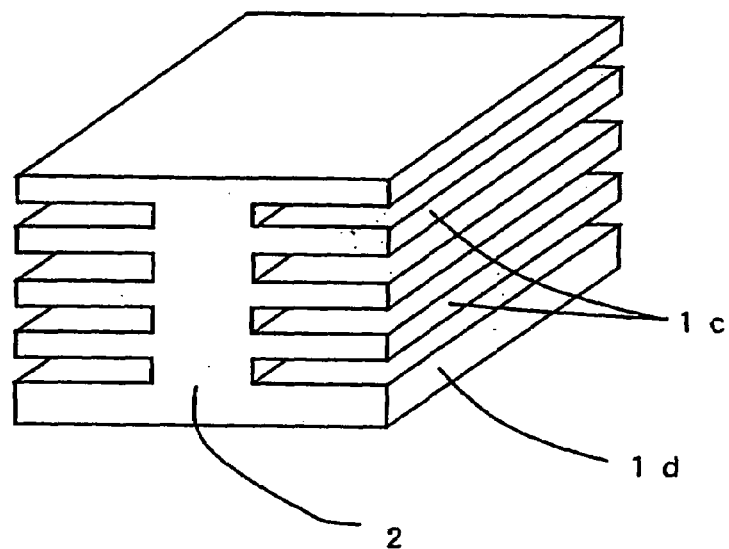
FIG. 14 shows a perspective view and a side view illustrating construction of a conventional heatsink.
Figure 14B:
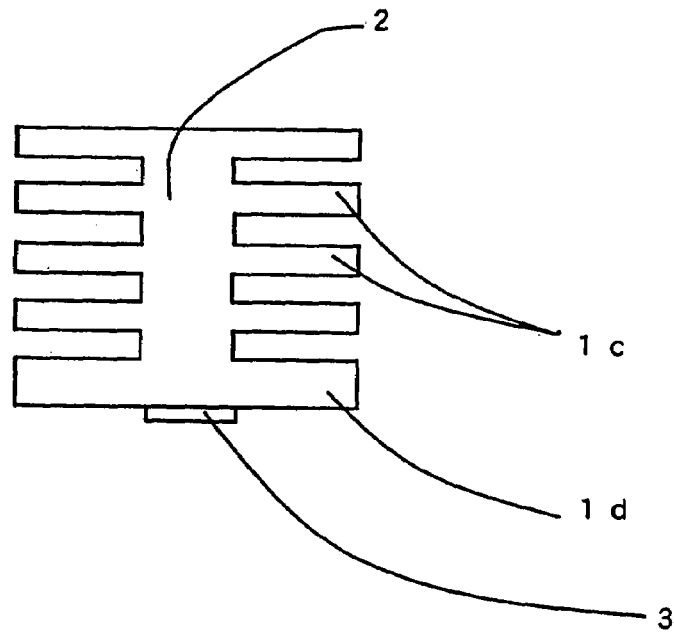

The only possible disadvantageous point is that the air flow area per unit area is smaller than that of the conventional heatsink shown in FIG. 13 (a) when size of the top part of which is the same. In other words, in the case of the air flow area 7e of the conventional heatsink which is marked with diagonal lines in FIG. 13 (a), the area is calculated by subtracting the total area of all of the fins 1 from the total area on the top surface of the heatsink. In the case of the construction of the present invention, however, approximately 50% of the area on the top surface of the heatsink is covered with the side faces of the fins 1. Therefore, the air flow area is reduced by that amount.

Even though the air flow area is reduced, when the fins 1 are disposed on both sides of the approximately prism-shaped column, the column can achieve a sufficient heat diffusion effect and air can be convected very smoothly. Thus, significantly increased heat dissipation properties can be achieved compared with the conventional heatsink.

In the heatsink shown in FIG. 3 (b), the axis of the fins 1 are set such that it has a predetermined angle θ against the base line 9a. By positioning the fins 1 on both side faces of the column 2 at a predetermined angle θ in such a manner that the end faces of the fins 1 are parallel to the base line 9b on the top surface of the heatsink, the air flow section 7b can be extended even wider than the conventional heatsink shown in FIG. 13 (a) while maintaining the surface area of the fins and height of the heatsink at the same level as the heatsink described in FIG. 3.

The heatsink illustrated in FIG. 3 (b) has the air flow section twice as large as the air flow section 7a illustrated in FIG. 3 (a), thus realizing even higher heat dissipation properties. Furthermore, since the fins 1 are tilted by an angle α and positioned, air flow coming in from the top of the heatsink becomes an air flow 5b. The air flow 5b then is led along the top surface of the fins 1 to the surface of the column 2 in addition to the air flow 5a, thereby further improving the heat dissipation properties.

FIG. 4 (a) shows a heatsink which has the fins 1 disposed radially with one point on the base line 9a as base point. In this case, the air flow area can be increased as in the case of FIG. 3 (b) compared with FIG. 3 (a), further enhancing the heat dissipation properties.

FIG. 4 (b) shows the heatsink of FIG. 3 (a) in which the fins 1 are bent at right angles. Such heatsinks can also achieve the same performance properties as the heatsinks illustrated in FIG. 3 (b) and FIG. 4 (a).

The Third Embodiment

Figure 5:
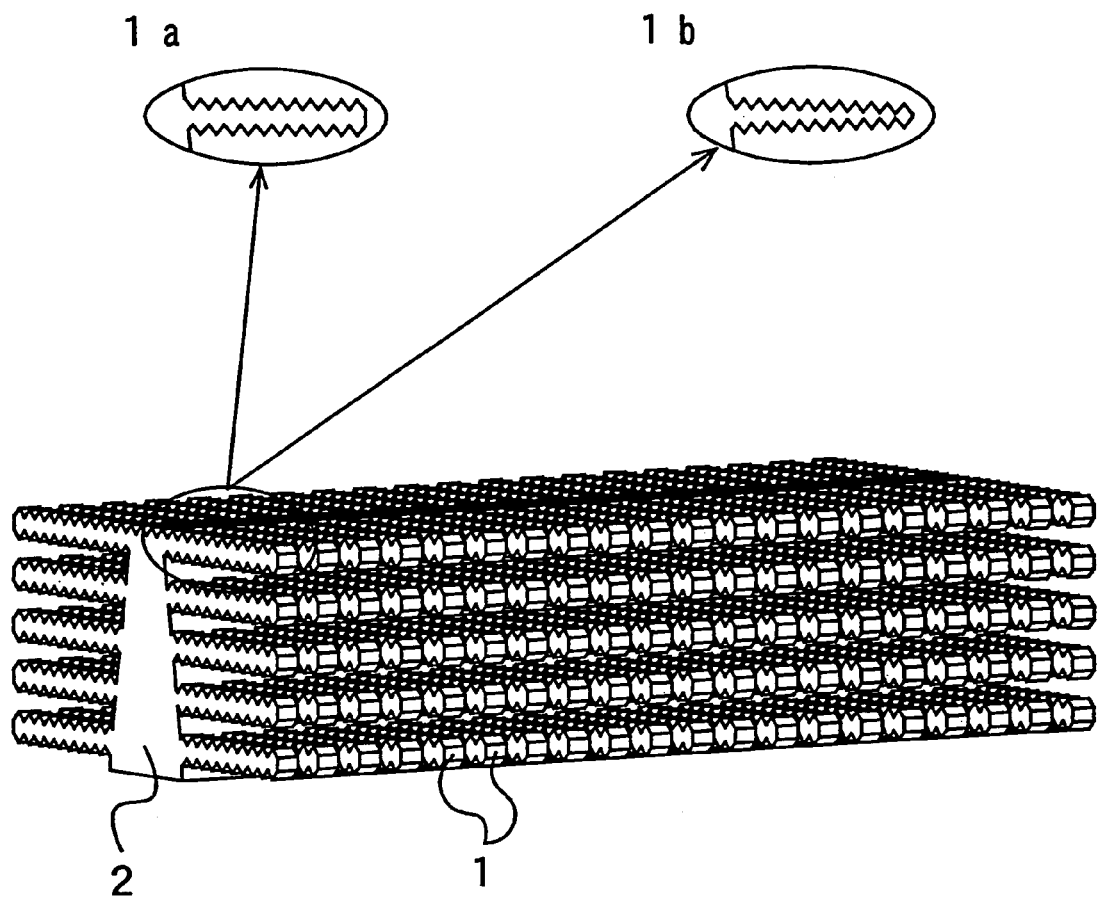
FIG. 5 shows a perspective view of fins of the heatsink in accordance with the first and second preferred embodiments of the present invention.

FIG. 5 shows a perspective view of the fins of the heatsink in accordance with the first and second preferred embodiments of the present invention. As the external shape of the fins 1 in FIG. 5 illustrates, by forming protrusions and recesses on the surface of the fins 1 of the heatsink, the surface area increases enhancing the heat dissipating capability. The protrusions and recesses can be formed only on a part of the fins 1. Furthermore, even if they are formed on some of the fins, the same effect can be obtained. The surface of the fins 1 can be provided with dimples. The fins 1 can be formed such that the width near the bottom and the top end are the same as shown in FIG. 5 1a. The fins 1 can also be formed such that they have diminishing taper either from bottom to top or top to bottom as shown in FIG. 5 1b.

The Fourth Embodiment

The cooling apparatus of the present invention is described below with reference to FIGS. 6 and 7.

Figure 6A:
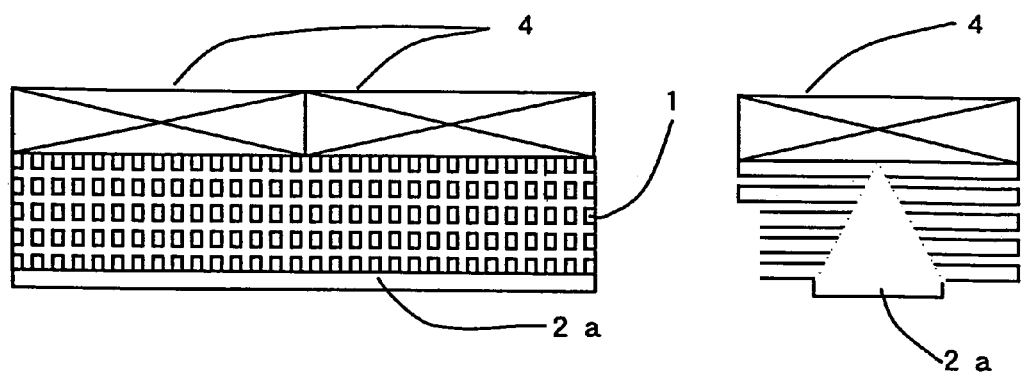
FIG. 6 shows front views and side views of the heatsink and the cooling apparatus in accordance with the first and second preferred embodiments of the present invention.
Figure 6B:
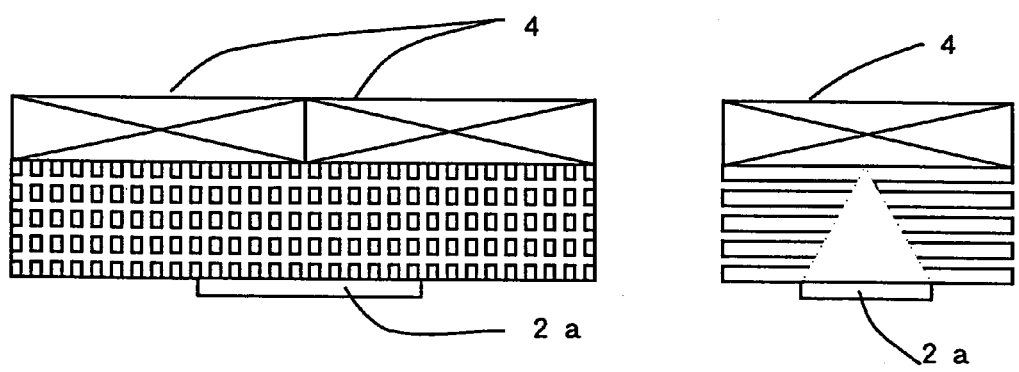

FIGS. 6 (a) and (b) show front views and side views of the heatsink and the cooling apparatus in accordance with the first and second preferred embodiments of the present invention. FIGS. 7 (a), (b) and (c) show side views which illustrate air flow of the cooling apparatus.

In this embodiment, as FIGS. 6 (a) and (b) show, the whole face or part of the face where the heat producing element is mounted, has a protuberant heat conducting plate section 2a formed thereon. In forming the plate section 2a, some space can be provided in between the heat receiving face and the fins 1 disposed in the vicinity of the plate section 2a. Therefore, air flow created by the cooling fan 4 can be effectively led to the surface of the fins 1 near the heat receiving face. A heat receiving face is formed on the heat producing element mounting section of the plate section 2a.

Specific air flow is described hereinafter with reference to FIGS. 7 (a), (b) and (c). As shown in FIG. (a), the existence of the plate section 2a of the column 2 allows the air flow 5a from the cooling fan 4 to be led directly from the top to the bottom of the heatsink. In other words, as the air flow 5a can be led to the surface of the fins 1 near the heat receiving face as previously mentioned, the function of the heat dissipating fins is enhanced, thus the heat dissipating properties of the heatsink are improved.

Figure 7A:
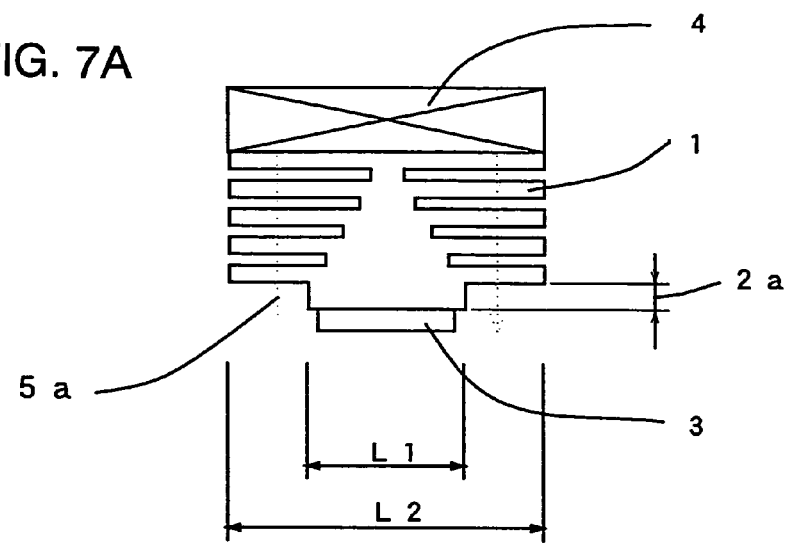
FIG. 7 shows side views which illustrate air flow of the heatsink and the cooling apparatus in accordance with the first and second preferred embodiments of the present invention.
Figure 7B:
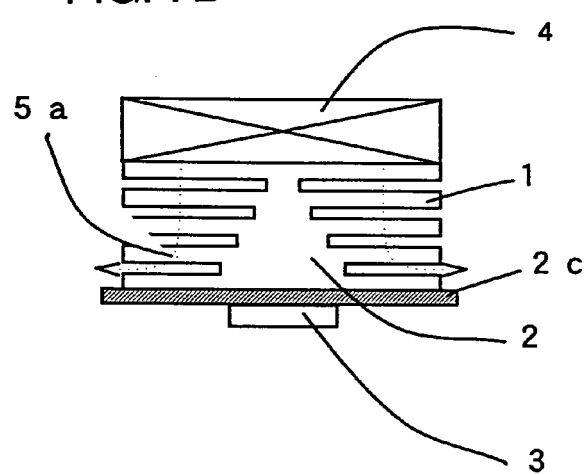
Figure 7C:
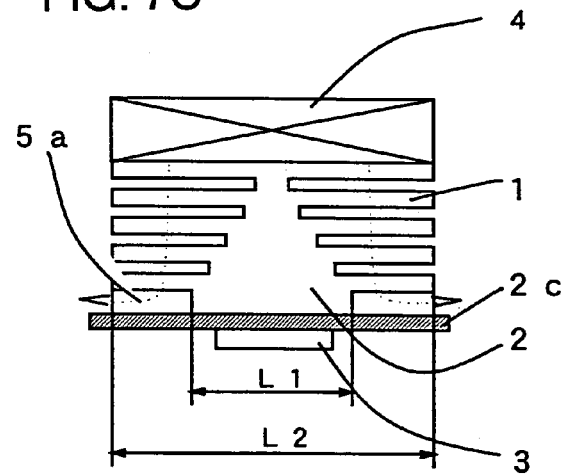

In FIGS. 7 (b) and (c), a comparison is made between the columns 2 with and without the plate section 2a on condition that the heat diffusion plate 2c and the heat producing element 3 are provided. In the construction shown in FIG. 7 (b), the fins 1 near the heat receiving face contact directly with the heat diffusing plate 2c because of the absence of the plate section 2a. Therefore, air can not be sent to the fins 1 disposed on the lower part. Compared with this, in the construction illustrated in FIG. 7 (c), the plate section 2a is provided on the column 2. By setting a width L1 of the heat conducting plate section 2a narrower than a width L2 of the heat sink, space is created between the plate section 2a and the heat diffusing plate 2c, thereby allowing air to reach the fins 1 placed at the lower part near the heat receiving face.

The Fifth Embodiment

The manufacturing method of the heatsink of the present invention is described below with reference to FIGS. 8, 9 and 10.

Figure 8A:
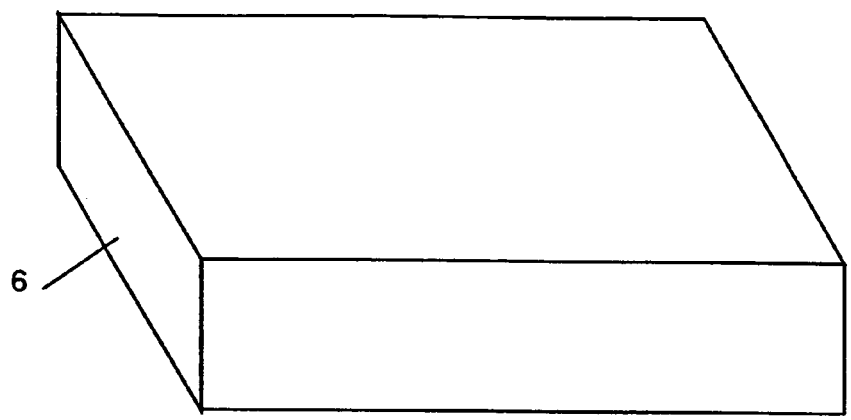
FIG. 8 shows a perspective view illustrating a manufacturing method of the heatsink in accordance with the first and second preferred embodiments of the present invention.
Figure 8B:
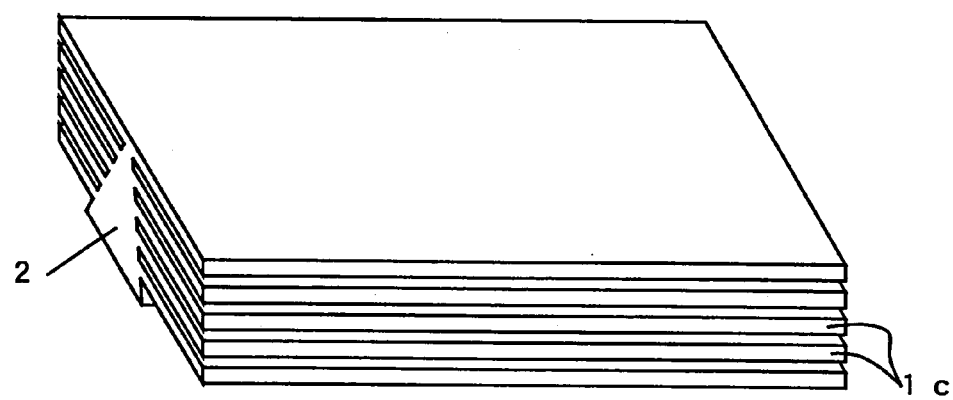
Figure 8C:
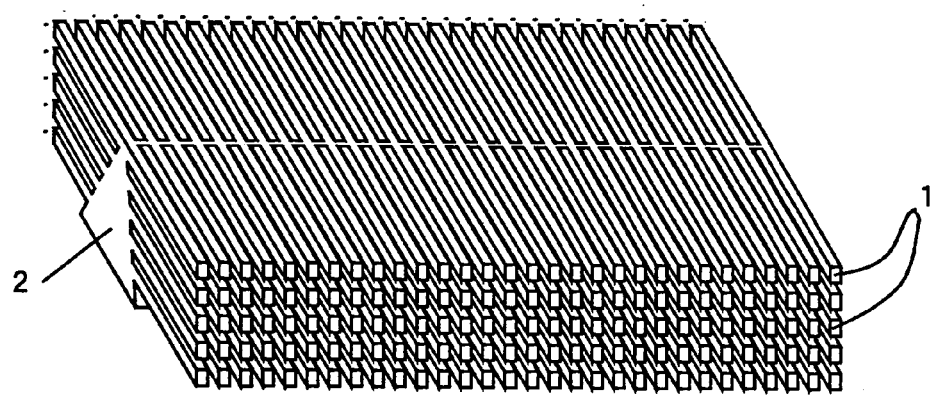

FIG. 8 (a) shows the initial condition of a heat conductive material 6. FIG. 8 (b) shows a first process in which a plurality of plate fins 1c are formed along the length of the column 2 by a cutting, extrusion or pultrusion method. FIG. 8 (c) shows a second process in which a plurality of fins 1 are formed on both side faces of the column 2 by providing slits at right angle to the length of the plate fins 1c.

The first process is conducted by a cutting, extrusion or pultrusion method. The example below refers to the extrusion method.

Figure 9A:
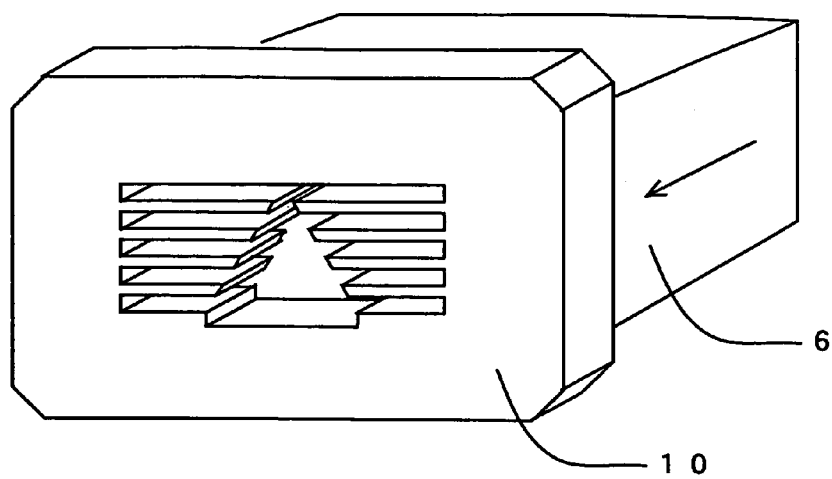
FIG. 9 shows perspective views illustrating an extrusion process of a manufacturing method of the heatsink in accordance with the first and second preferred embodiments of the present invention.
Figure 9B:
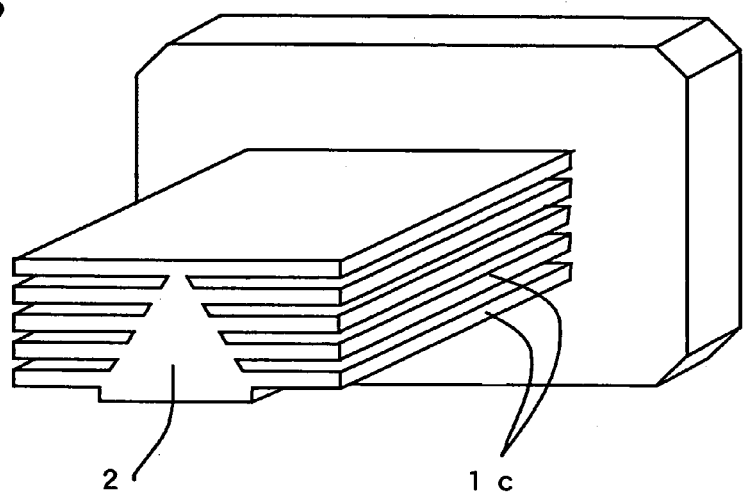
Figure 9C:
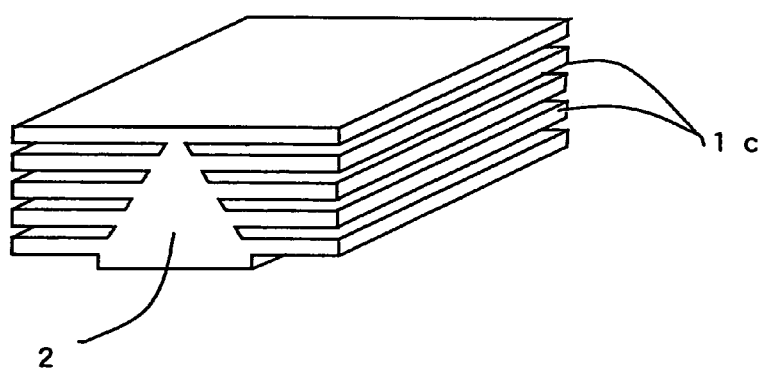

In FIG. 9 (a), a high-temperature heat conductive material is pressed into an extrusion die 10 in the direction marked by an arrow. Successively, the material 6 is pressed out and plastically deformed into the same shape as the mold cavity. At this point, the column 2 and the plate fins 1c are formed simultaneously as shown in FIG. 8 (b). The first process is completed by cutting at a predetermined length the material 6 which is pressed out from the mold cavity as shown in FIG. 9 (c).

Figure 10A:
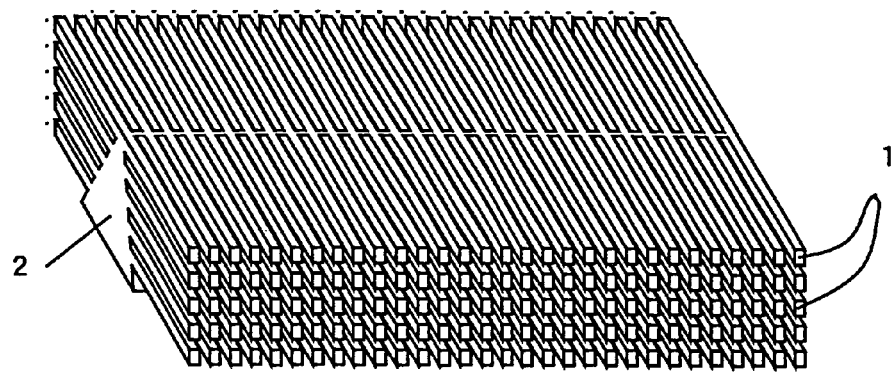
FIG. 10 shows a perspective view of the heatsink and side views of the heatsink placed on a jig during a cutting process of the manufacturing method of the heatsink in accordance with the first and second preferred embodiments of the present invention.
Figure 10B:
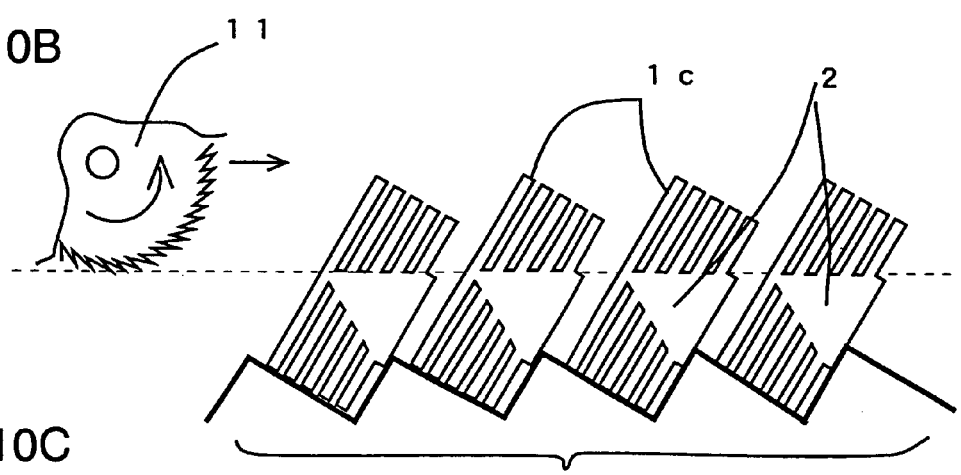
Figure 10C:
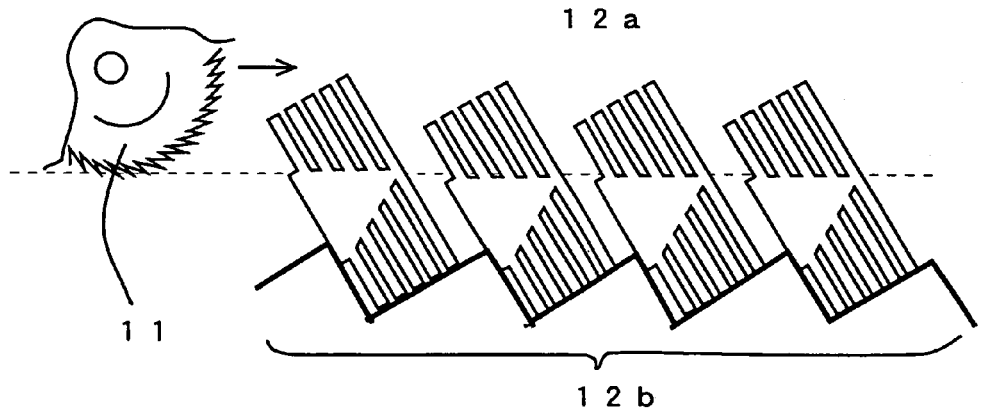

In the second process, the shape of the heatsink having a plurality of fins shown in FIG. 10 (a) is formed by the cutting process. In this embodiment, as shown in FIG. 10 (b), a cutting tool 11 is used to slit a plurality of heatsinks which are placed parallel to one another on a tilted jig 12a, so as to convert plate fins on one side to a plurality of fins 1. Successively, as FIG. 10 (c) shows the plate fins 1c on the other side are processed to modify them to the fins 1.

If a plurality of cutting tools are placed parallel to one another and the heatsinks are machinedat a time in the above-mentioned second process, the process requires less time.

Furthermore, the second process can be processed by the laser cutting method.

This embodiment achieves efficient and low cost manufacture of compact and high-performance heatsinks with a plurality of fins. The heatsinks produced by the manufacturing method of this embodiment have thoroughly one-piece construction, therefore they can achieve a remarkably superior heat dissipation capability.

The Sixth Embodiment

Figure 11A:
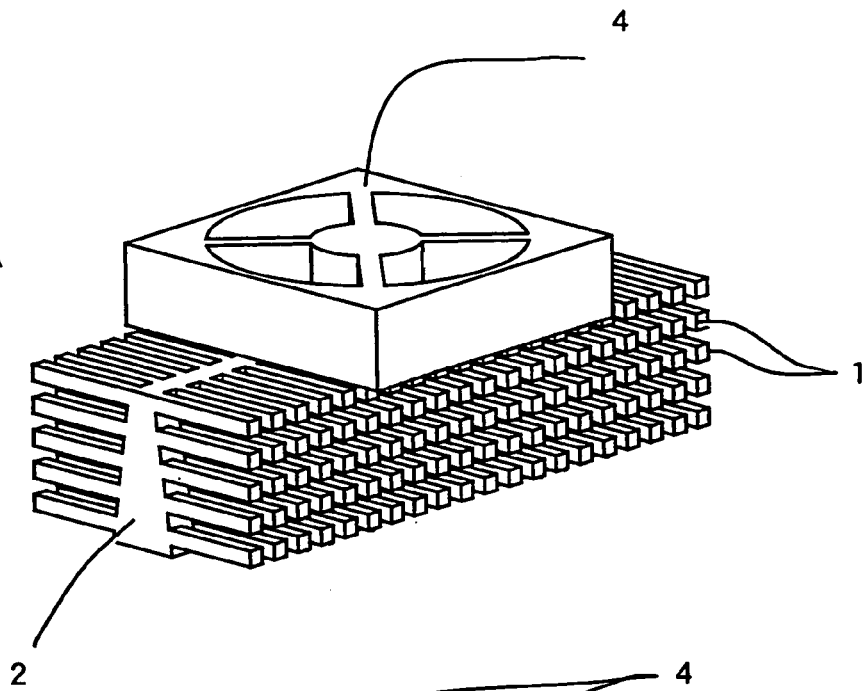
FIG. 11 shows perspective views of the cooling apparatus having cooling fans mounted on the top of the heatsink in accordance with the first and second preferred embodiments of the present invention.
Figure 11B:
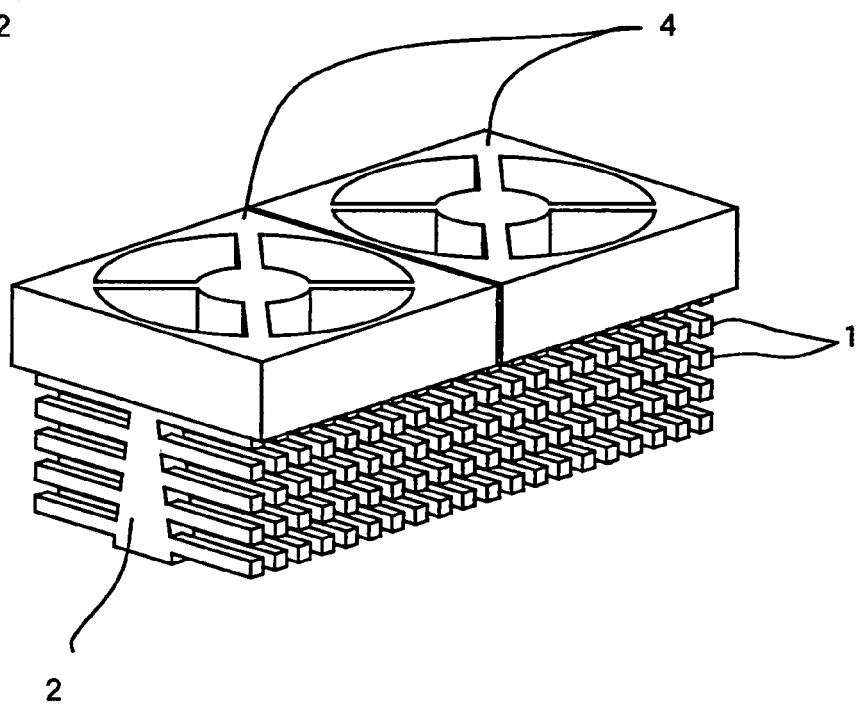
Figure 12A:
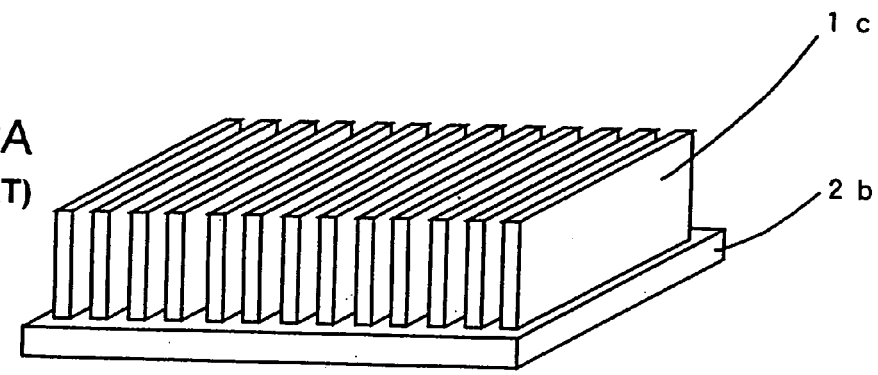
FIG. 12 shows perspective views illustrating construction of a conventional heatsink.
Figure 12B:
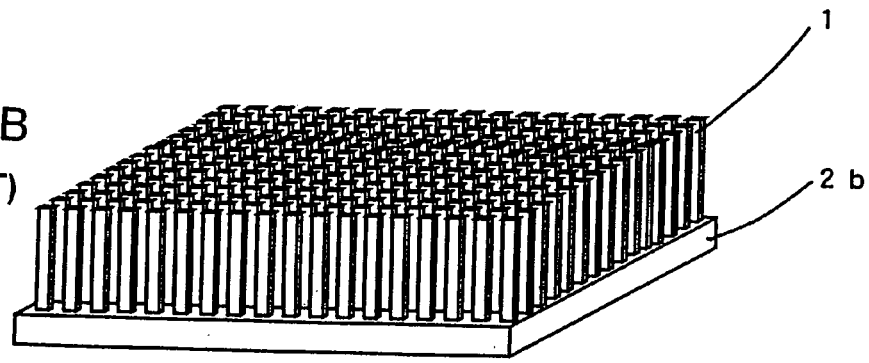

FIG. 11 shows perspective views of the cooling apparatus having cooling fans mounted on the top of the heatsink in accordance with the first and second preferred embodiments of the present invention. FIGS. 11 (a) and (b) show the cooling apparatus where one cooling fan and two cooling fans are respectively disposed on the heatsink of the present invention. The cooling fan 4 can be mounted on top of the heatsink with screws, adhesives, clips, belt, or clip pins.

The height of the heatsink of the present invention can be lowered while maintaining high cooling capability. Therefore, the overall height can be kept low even when the cooling fan 4 is mounted, thereby achieving a compact cooling apparatus.

As a cooling means for the cooling apparatus, the cooling fan 4 was used in this embodiment, however, heat exchange elements such as Peltier elements can alternatively be used as a cooling means. As yet another cooling means, a heat pipe can be used to transfer the heat of the heatsink to an other place to cool it down. It is also possible to immerse the heatsink into liquid to cool it down.

As described above, the heatsink of the present invention, which forms part of the cooling apparatus of this embodiment has fins on both side faces of the column 2 functioning as a heat conducting section. The cooling apparatus of this embodiment will allow superior cooling capability compared with a conventional cooling apparatus of the same volume. In other words, when the performance is set to be the same as that of the conventional cooling apparatus, the cooling apparatus of this embodiment can be the smaller and the lighter.

As described thus far, the heatsinks of the present invention improve the diffusing effect of the heat produced by the heat producing element by introducing a heat conducting section of a pole-type column. Furthermore, sufficient heat dissipating area can be secured since the fins are provided on both faces of the column, thereby realizing high heat dissipation capability and a reduction in size.

Introduction of the heatsink of the present invention allows the cooling apparatus of the present invention to achieve higher performance and smaller size compared with the conventional apparatus.

The manufacturing method of the heatsink of the present invention provides productive and low-cost manufacturing of high performance heatsinks.

What is claimed is:

1. A heatsink comprising:
   (a) a column having a heat receiving face, wherein a cross section of said column has one shape selected from trapezoid, triangle, and a shape whose sectional width decreases as it extends away perpendicular to said heat receiving face, said heat receiving face having a protuberant heat conducting plate section at least one part thereon;
   (b) a plurality of pillar-type protrusions provided on two faces other than the heat receiving face of said column in such a manner that they are at a predetermined oblique angle against the heat receiving face, said plurality of pillar-type protrusions being configured to form at least one uninterrupted fluid flow path between respective pillar-type protrusions in a direction in which the cross-sectional width of said column changes, and
   (c) a plurality of parallel pillar-type protrusions provided on the two faces in a row that is closer to said heat receiving face than said plurality of pillar type protrusions and are formed parallel to said heat receiving face.

2. The heatsink of claim 1, wherein at least one of said pillar-type protrusions has protrusions and/or recesses on its surface.

3. The heatsink of claim 1, wherein the heat receiving face is spaced away from the nearest pillar-type protrusion(s).

4. The heatsink of claim 1, wherein the vertical distance to the heat receiving face from the end of each of said pillar-type protrusions on a column side is shorter than that from the other end.

5. The heatsink of claim 4, wherein the height of each of said pillar-type protrusions does not go beyond the height of said column.

6. The heatsink of claim 4, wherein at least one of said pillar-type protrusions has protrusions and/or recesses on its surface.

7. The heatsink of claim 4, wherein the heat receiving face is spaced away from the nearest pillar-type protrusion(s).

8. The heatsink of claim 1, wherein the at least one face of said column forms a curve extending from the bottom of said column to the top of said column.

9. The heatsink of claim 1, wherein at least one continuous row of said pillar-type protrusions extend from said column at the same angle relative to said column, each of said pillar-type protrusions in said at least one continuous row extending from said column at the same vertical height.

10. The heatsink of claim 1, further comprising a blower coupled to said column for blowing fluid in said direction in which the cross-sectional width of said column changes.

11. The heatsink of claim 1, wherein said respective pillar-type protrusions face each other.

12. A cooling apparatus comprising:
a heatsink comprising:
(a) a column having a heat receiving face, wherein a cross section of said column has a shape whose sectional width decreases as it extends away perpendicular to said heat receiving face, said heat receiving face having a protuberant heat conducting plate section at least one part thereon;
(b) a plurality of pillar-type protrusions provided on two faces other than the heat receiving face of said column in such a manner that they are at a predetermined oblique angle against the heat receiving face, wherein at least one continuous row of said pillar-type protrusions extend from said column at the same angle relative to said column, each of said pillar-type protrusions in said at least one continuous row extending from said column at the same vertical height; and
(c) a cooling means mounted on said heatsink to provide a fluid flow between said plurality of pillar-type protrusions in a direction transverse to said heat receiving face, and
(d) a plurality of parallel pillar-type protrusions provided on the two faces in a row that is closer to said heat receiving face than said plurality of pillar type protrusions and are formed parallel to said heat receiving face.

13. The cooling apparatus of claim 12, wherein the heat receiving face is spaced away from the nearest pillar-type protrusion(s).

14. The cooling apparatus of claim 12, wherein said cooling means in selected from one of an air blowing means, a Peltier element, a heat pipe and dipping in liquid.

15. The cooling apparatus of claim 14, wherein said air blowing means is disposed on the top face of said heatsink, facing the heat receiving face.

16. The cooling apparatus of claim 14, wherein said air blowing means is a fan which is mounted on the top face of said heatsink in such a manner that the fan sends wind to the heat receiving face.

17. The cooling apparatus of claim 12, wherein at least one of said pillar-type protrusions have protrusions and/or recesses on its surface.

18. The cooling apparatus of claim 12, wherein an opening of said cooling means is positioned to face a surface of said heat sink closest to the heat receiving face.

19. A cooling apparatus, comprising:
a heatsink comprising:
a column having a heat receiving face and two side faces which are not parallel to said heat receiving face, said column having a cross section whose sectional width decreases as the column extends away from the heat receiving face perpendicular to said heat receiving face, said heat receiving face having a protuberant heat conducting plate section at least one part thereon;
a plurality of fins provided on said two side faces in such a manner that they are at a predetermined oblique angle against the heat receiving face, and
a plurality of parallel pillar-type protrusions provided on the two side faces in a row that is closer to said heat receiving face than said plurality of fins and are formed parallel to said heat receiving face; and
a blower coupled to said heat sink for forcing fluid through fluid flow passages defined between said plurality of fins.

20. The cooling apparatus of claim 19, wherein an opening of said blower is positioned to face a surface of said heat sink closest to the heat receiving face.

21. A heatsink comprising:
(a) a column having a heat receiving face, wherein a cross section of said column decreases at it extends away perpendicular to said heat receiving face, said heat receiving face having a protuberant heat conducting plate section at least one part thereon;
(b) a first plurality of pillar-type protrusions formed by a plurality of first cut slits formed on a face other than the heat receiving face of said column, and a plurality of cross slits formed transversely to said first cut slits, said first plurality of pillar-type protrusions being formed at a predetermined oblique angle with respect to the heat receiving face and defining a first fluid flow section;
(c) a second plurality of pillar-type protrusions formed by a plurality of second cut slits formed on another face of said column, and a plurality of second cross slits formed transversely to said second cut slits, said second plurality of pillar-type protrusions being formed at a predetermined oblique angle with respect to the heat receiving face and defining a second fluid flow section, and
(d) a plurality of parallel pillar-type protrusions provided on the two faces in a row that is closer to said heat receiving face than said first and second pluralities of pillar type protrusions and are formed parallel to said heat receiving face,
wherein said first fluid flow section is connected to said second fluid flow section.

22. The heatsink of claim 21, wherein the heat receiving face is spaced away from the nearest pillar-type protrusion.

23. A heatsink comprising:
(a) a column having a heat receiving face, wherein a cross section of said column has a shape whose sectional width decreases as it extends away perpendicular to said heat receiving face, said heat receiving face having a protuberant heat conducting plate section at least one part thereon;
(b) a plurality of pillar-type protrusions provided on two faces other than the heat receiving face of said column in such a manner that they are at a predetermined oblique angle against the heat receiving face, said plurality of pillar-type protrusions being configured to form at least one uninterrupted fluid flow path between respective pillar-type protrusions in a direction in which the cross-sectional width of said column changes, said at least one uninterrupted fluid flow path extending along said at least one face from said heat receiving face to the end of said column having a decreased sectional width, and (c) a plurality of parallel pillar-type protrusions provided on the two faces in a row that is closer to said heat receiving face than said plurality of pillar type protrusions and are formed parallel to said heat receiving face.

24. A cooling apparatus comprising:

a heatsink comprising:

(a) a column having a heat receiving face, wherein a cross section of said column has a shape whose sectional width decreases as it extends away perpendicular to said heat receiving face, said heat receiving face having a protuberant heat conducting plate section at least one part thereon;

(b) a plurality of pillar-type protrusions provided on two faces other than the heat receiving face of said column in such a manner that they are at a predetermined oblique angle against the heat receiving face, (c) a plurality of parallel pillar-type protrusions provided on the two faces in a row that is closer to said heat receiving face than said plurality of pillar type protrusions and are formed parallel to said heat receiving face; and a cooling means mounted on said heatsink to provide a fluid flow between said plurality of pillar-type protrusions in a direction transverse to said heat receiving face.

25. The cooling apparatus of claim 24, wherein an opening of said cooling means is positioned to face a surface of said heat sink closest to the heat receiving face.

* * * * *